United States Patent
Manchester

(10) Patent No.: US 6,713,842 B1
(45) Date of Patent: Mar. 30, 2004

(54) MASK FOR AND METHOD OF FORMING A CHARACTER ON A SUBSTRATE

(75) Inventor: Terence Manchester, Los Gatos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/639,798

(22) Filed: Aug. 17, 2000

Related U.S. Application Data
(60) Provisional application No. 60/149,434, filed on Aug. 18, 1999.

(51) Int. Cl.$^7$ ............... H01L 23/544; H01L 21/76; H01L 21/301; G01R 31/26
(52) U.S. Cl. ............... 257/620; 257/797; 438/14; 438/16; 438/401; 438/462; 438/959; 438/975; 430/5
(58) Field of Search ................ 257/797, 620, 257/E23.179, E21.525; 430/5, 313, 292, 312; 438/14, 401, 462, 959, 16, 7, 975; 359/2, 23, 463; 283/72, 85, 86, 93

(56) References Cited

U.S. PATENT DOCUMENTS

| | | | |
|---|---|---|---|
| 4,490,440 A | * | 12/1984 | Reber ............... 428/620 |
| 5,115,456 A | * | 5/1992 | Kimura et al. ........... 378/35 |
| 6,133,585 A | * | 10/2000 | Murata ............... 257/59 |

* cited by examiner

*Primary Examiner*—Long Pham
*Assistant Examiner*—Shrinivas H Rao

(57) ABSTRACT

A mask for and method of forming a character on a substrate of a semiconductor device that can be clearly observed even if positioned over complex and random patterns formed on the substrate. The mask includes a transparent medium that includes one or more plurality of regions that each includes a plurality of opaque gratings or lines. The gratings are configured to form a character (or indicia) that contrasts with the remainder of the medium. When light is passed through the mask, the light is refracted off the gratings, thereby producing markedly different colors and/or intensities of light on the substrate. The mask is used during a positive or negative etching process to form a character on a surface of a semiconductor substrate that can be easily viewed by an observer without magnification.

9 Claims, 3 Drawing Sheets

MASK FOR AND METHOD OF FORMING A CHARACTER ON A SUBSTRATE

RELATED APPLICATION

This application claims priority from Provisional Application No. 60/149,434 filed on Aug. 18, 1999 entitled "MASK FOR AND METHOD OF FORMING A CHARACTER ON A SUBSTRATE", the entire disclosure of which is incorporated by referenced herein.

FIELD OF THE INVENTION

The present invention relates to high-density semiconductor devices, and in particular, to a mask for and method of forming a character on a substrate of a semiconductor device that is visible by an observer without aid of magnification even when the character is formed on a substrate having complex and random patterns.

BACKGROUND OF THE INVENTION

Etching processes are commonly used in semiconductor manufacturing technology to transfer patterns to semiconductor substrates for the purpose of forming circuits on the substrate. A standard illuminator arrangement used in the patterning process is depicted in FIG. 1. The illuminator arrangement 100 includes a radiation concentrator 110, such as an elliptical mirror, that reflects energy emitted by radiation source 120 into the entrance pupil of the illuminator, i.e., input lens 130. The illuminator of the exposure tool may employ intensity randomizer 140, which randomizes the intensity of the radiation in the illuminator. Intensity randomizer 140, for example a fly-eye lens, is used in the microlithography exposure tool illuminator in order to insure light intensity uniformity at the projection lens entrance. The exposure tool illuminator may also employ a partial coherence aperture 150, which reduces the undesirable impact of the peripheral regions of the intensity randomizer on the uniformity of the illumination.

The physical size of the randomizer 140 or the size of the opening in the partial coherence aperture 150 defines the area (size) of the effective light source of the projection system that is used to form the image of reticle 170 on wafer 190. Condenser lens 160 focuses the effective light source onto the entrance pupil of projection lens 180 through reticle 170. Projection lens 180 projects the pattern contained in reticle 170 onto the photoresist layer of the wafer 190.

In the typical etching process of semiconductor devices, a protective etching mask or photoresist layer is first formed employing a layer of photoresist material ("resist") disposed on a major surface of the semiconductor device. This protective resist etch mask is designed to facilitate the formation of a desired pattern of lines and spaces (resist areas) in the resist layer based on a predetermined etch pattern. Thus, when an optical source, such as UV light, passes through the reticle and contacts these predetermined resist areas, the predetermined etch pattern is created in the resist structure which exposes the requisite portions of the semiconductor surface for subsequent etching purposes. Once the protective etching resist mask is in place on the semiconductor surface, etching of the exposed areas can commence to produce a semiconductor having a predetermined etched pattern.

One of the first resist materials used in semiconductor fabrication produced a negative image and thus was called a negative resist. In a negative resist, areas where the optical source strikes becomes polymerized and more difficult to remove. When the resist is "developed" (subjected to a solvent), the polymerized regions remain and the unpolymerized areas are removed. A second, and more commonly used, etching process is called a positive resist. Positive resists are based on a totally different chemistry than negative resists. In a positive resist etching process, exposure to an optical source changes the positive resist material so that it is solubilized and can be more easily removed. Since the exposed regions are removed, the resist is referred to as positive.

Once the circuitry of the semiconductor device is formed, it can be difficult to distinguish one particular semiconductor device from another. Accordingly, there is a need for a mask for and method of forming a character on a substrate of a semiconductor device that is visible by an observer without aid of magnification. The character could be used to distinguish one semiconductor device from another. Due to the existence of complex and random patterns on the substrate of the semiconductor devices, the mask and method should be designed to form a distinguishing character that is clearly visible on semiconductor devices having preexisting patterns.

SUMMARY OF THE INVENTION

The present invention relates to a mask and method to form a character on a substrate of a semiconductor device that can be clearly observed even if positioned over complex and random patterns formed on the substrate.

The mask of the present invention is used during an etch process to form a readable character on a surface of a substrate of a semiconductor device that is visible by an observer without magnification. The mask includes a medium that is generally transparent and a region that provides a character (or indicia). The region includes one or more plurality of regions that each includes a plurality of gratings or lines. The gratings are generally opaque, thereby providing a contrast between the region and a remainder of the medium. The gratings are configured to form a character (or indicia) that contrasts with the remainder of the medium.

The region of the exemplary embodiment includes a first region formed by a plurality of first gratings or lines and a contrasting second region formed by a plurality of second gratings or lines. In the exemplary embodiment the first and second gratings include a plurality of parallel lines with transparent spaces evenly arranged between the lines. The first gratings are generally oriented in a direction that is non-parallel to the direction of the second gratings. The non-parallel arrangement of the first grating and the second grating provides a contrast therebetween. The preferred embodiment of the present invention utilizes the contrast between two different gratings to create a character, such as an alphanumeric symbol, or some other symbol, shape, logo, icon, etc.

When light is passed through the mask, the light is refracted off the gratings, thereby producing markedly different colors and/or intensities of light on the substrate. The image formed on the substrate is easily seen at 1X magnification by an observer when viewed under normal, broad spectrum, visible light.

The present invention includes a method of manufacturing a semiconductor device using the mask described above. The method includes a step of coating a substrate with a photosensitive material. The method further includes a step of projecting light through a mask onto the coating. The mask used in the process is that described above and it includes a region having a character (or other indicia) within the region. The mask is used to project an image onto the substrate of the semiconductor device. The method includes a step of removing a portion of the coating based upon exposure to the light. The portion of the coating that is removed is based upon whether a negative resist or a positive resist is used and depends upon whether it is desired to positively or negatively etch the character into the substrate. The method also includes a step of etching exposed portions of the substrate that are not covered by a remaining portion of the coating to form a character visible by an observer without aid of magnification. The result of the method set forth above is a substrate of a semiconductor device that has a character formed on a surface of the substrate, which can be used to identify a particular semiconductor device.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

DETAILED DESCRIPTION OF THE INVENTION

Figure 2:
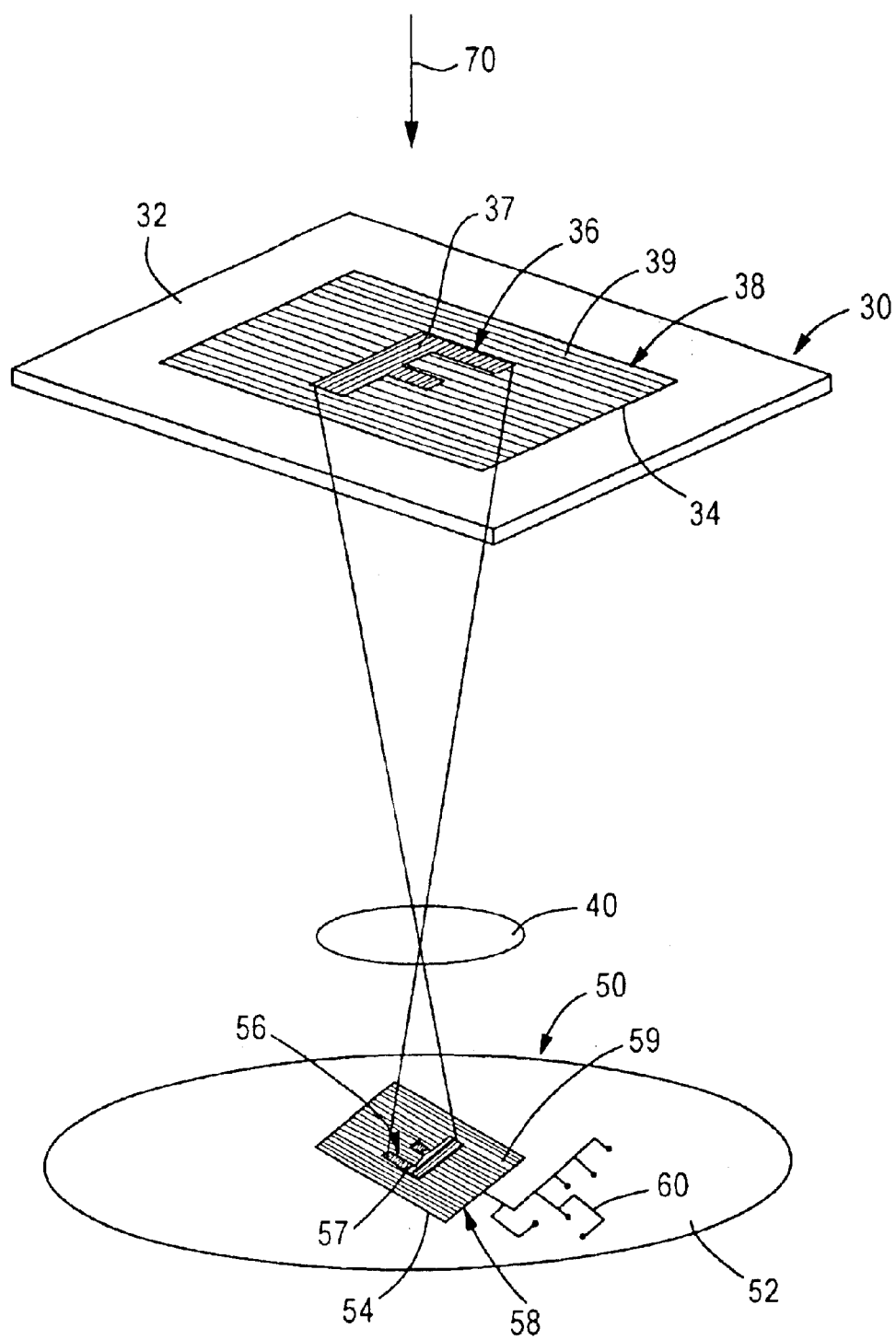
FIG. 2 is a perspective view of a mask and semiconductor device according to an exemplary embodiment of the present invention.

FIG. 2 depicts a preferred exemplary embodiment of a mask 30 and an etched substrate 50 of the present invention. The mask 30 of the present invention is used during an etch process to form a readable character on a surface of a substrate of a semiconductor device that is visible by an observer without magnification.

The mask or reticle 30 depicted in FIG. 2 includes a medium or substrate 32 that is generally transparent and a region 34 that provides a character (or an indicia). The region 34 includes one or more regions that each includes a plurality of gratings or lines. The gratings are generally opaque, thereby providing a contrast between the region 34 and a remainder of the medium 32. Note that in alternative embodiments the opaque portions of the mask 30 can be made transparent and vice versa, depending on whether a negative or a positive resist is used or depending on whether it is desired to positively or negatively etch the character into the substrate. The gratings are configured to form a character (or an indicia) that contrasts with the remainder of the medium 32. The gratings in the preferred embodiment are generally parallel within each region, although alternative embodiments include any variety of curved, straight or angled patterns or patterns made up of a plurality of dots or other figures or shapes, so long as the gratings contrast with the remainder of the medium 32.

The region 34 of the exemplary embodiment includes a first region 36 formed by a plurality of first gratings or lines 37 and a contrasting second region 38 formed by a plurality of second gratings or lines 39. The first gratings 37 and the second gratings 39 are generally opaque, thereby providing a contrast between the region 34 and a remainder of the medium 32. In the exemplary embodiment the first gratings 37 include a plurality of parallel lines with transparent spaces evenly arranged between the lines. Similarly the second gratings 39 include a plurality of parallel lines with transparent spaces evenly arranged between adjacent lines. In the exemplary embodiment the first gratings 37 are configured to extend in a direction that is perpendicular to a direction along which the second gratings 39 extend. The first gratings 37 are generally oriented in a direction that is non-parallel to the direction of the second gratings 39. For example, the first gratings 37 can be obliquely arranged or orthogonally arranged with respect to the second gratings 39. The non-parallel arrangement of the first gratings 37 and the second gratings 39 provides a contrast therebetween, making it easier for an observer to recognize the pattern embodied in the first gratings 37.

The preferred embodiment of the present invention utilizes the contrast between two different gratings, specifically the first gratings 37 and the second gratings 39 to create the character. The first gratings 37 are in a shape of an alphanumeric symbol and the second gratings 39 are formed around the perimeter of the alphanumeric symbol with the first gratings 37 abutting the second gratings 39. The second gratings 39 of the exemplary embodiment form a square shaped outer perimeter. Rather than forming the first gratings 37 as an alphanumeric symbol, any variety of other symbols can be used to distinguish a specific semiconductor device, for example, other symbols or shapes, logos, icons, etc.

Figure 1:
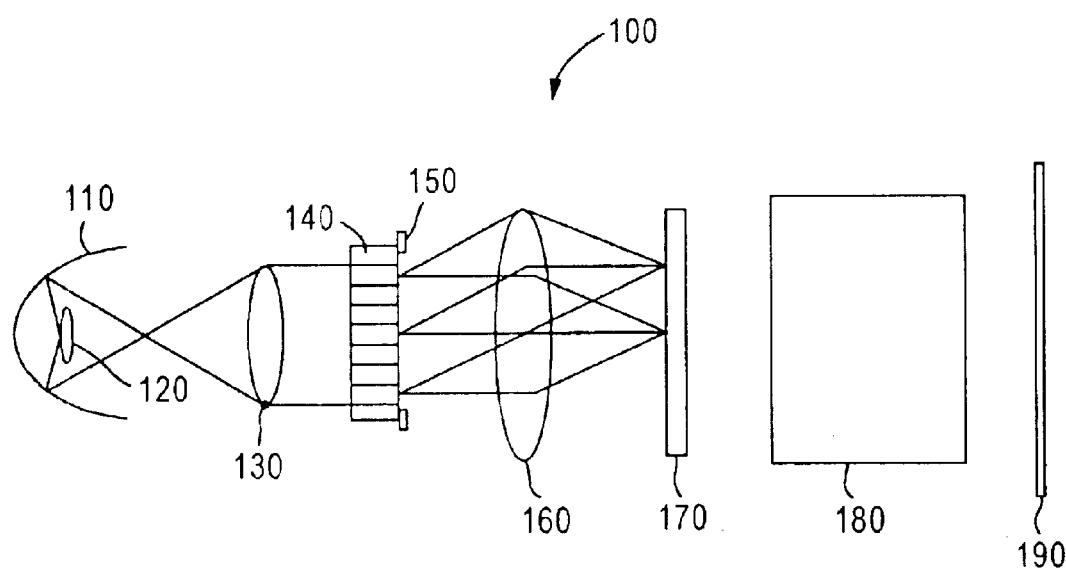
FIG. 1 is a schematic view of a standard illuminator arrangement.

As is described above in reference to the standard illuminator arrangement 100 depicted in FIG. 1, light 70 is projected through the mask 30 and through projection optics 40, which project the pattern on the mask 30 onto a photoresist or photosensitive coated substrate on the wafer. The opaque nature of the first gratings 37 and the second gratings 39 prevents light from passing therethrough, while the transparent medium 32 allows light to pass therethrough. When light 70 passes through the mask 30, the light is refracted off the gratings, thereby producing markedly different colors and/or intensities of light on the substrate 52. The image 50 formed on the substrate 52 is easily seen at 1X magnification by an observer when viewed under normal, broad spectrum, visible light. Tile optimum size of image 50 can be readily determined in a particular situation for unaided human observation. The image 50 includes a region 54 that provides a character (or indicia) that mimics region 34 of the mask 30. The region 54 of the exemplary embodiment includes a first region 56 formed by a plurality of first gratings or lines 57 and a contrasting second region 58 formed by a plurality of second gratings or lines 59. The first region 56 and the second region 58 mimic the first region 36 and the second region 38, respectively.

The image 50 is used during the etching process to provide an etched image on a surface of a semiconductor device that can be easily seen without the aid of magnification by an observer. The etched image can be provided on a substrate that either includes a pattern layer 60 formed beneath the character, or does not include existing patterning.

Figure 3:
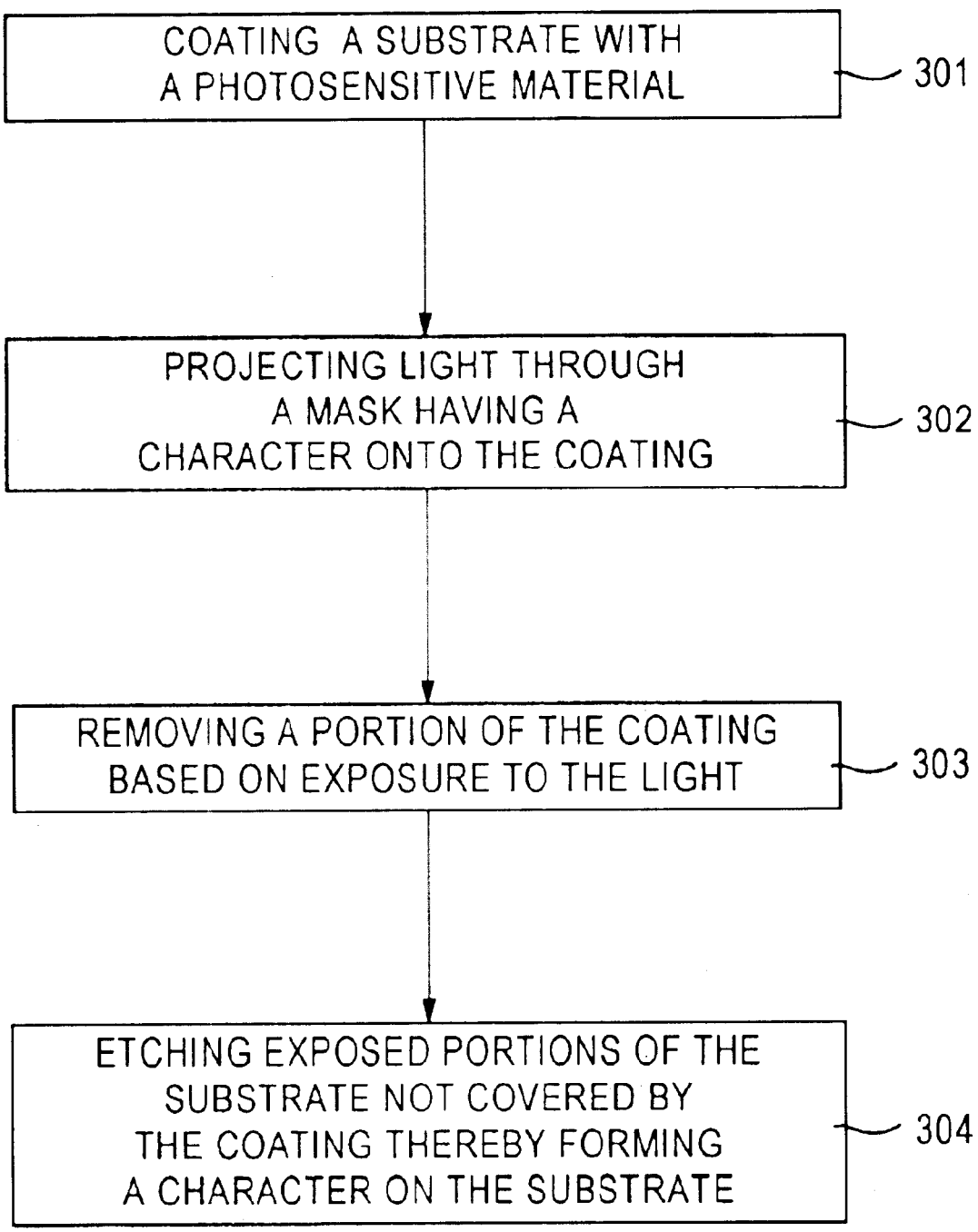
FIG. 3 is a flowchart setting forth a method of manufacturing a semiconductor device according to an exemplary embodiment of the present invention.

The present invention includes a method of manufacturing a semiconductor device. A preferred exemplary embodiment of the method is presented in FIG. 3 in a flowchart format. The method includes a step 301 of coating a substrate with a photosensitive material, such as that depicted in FIG. 2. As the process of coating a substrate with a photosensitive material is a standard process that is known to those of ordinary skill in the art, it is not discussed in detail herein. The method further includes a step 302 of projecting light through a mask onto the coating. The mask used in the process is that described in detail above with respect to mask 30 and it includes a region having a character (or other indicia) within the region. The mask generally includes a medium having a character formed thereon that includes at least one first grating extending in a first direction along the medium. The first grating is configured to allow light passing through the medium to pass in a different quantity than in a remainder of the medium, thereby providing a contrast between the first grating and the remainder of the medium. The character of the exemplary embodiment includes at least one second grating extending in a second direction along the medium, where the first direction is in a non-parallel orientation to the second direction. The mask 30 is used to project an image 50 onto the substrate of the semiconductor device, for example, as depicted in FIG. 2.

The method includes a step 303 of removing a portion of the coating based upon exposure to the projected light. The portion of the coating that is removed depends upon whether a negative resist or a positive resist is used and depends upon whether it is desired to positively or negatively etch the character into the substrate. The method also includes a step 304 of etching exposed portions of the substrate that are not covered by a remaining portion of the coating. This process is performed using conventional chemical etchants and conventional etching techniques.

The result of the method set forth above is a substrate of a semiconductor device that has a character formed on a surface of the substrate. The character mimics the image 50 depicted in Figure 2, and at least includes one first grating extending in a first direction along the surface of the substrate, wherein the first grating visually contrasts with a surrounding portion of the substrate such that the first grating is visible by an observer without aid of magnification. Alternative embodiments are discussed above with respect to region 34 on mask 30. For example, in an alternative embodiment the character further includes at least one second grating extending in a second direction along the surface where the first direction is in a non-parallel orientation to the second direction. In this embodiment the first grating is configured to visually contrast with the second grating such that the character is visible by an observer without aid of magnification.

The present invention advantageously provides a mask and method to form a character on a substrate of a semiconductor device that can be clearly observed even if positioned over complex and random patterns formed on the substrate.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well-known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising:

a substrate containing circuitry patterns thereon; and a character formed on a surface of said substrate, said character comprising at least one first grating extending in a first direction along said surface, wherein said at least one first grating visually contrasts with a surrounding portion of said substrate such that said at least one first grating is visible by an observer without aid of magnification.

2. The semiconductor device of claim 1 wherein said at least one first grating includes a plurality of parallel etched lines.

3. The semiconductor device of claim 1 wherein said at least one first grating is in a shape of an alphanumeric symbol.

4. The semiconductor device of claim 1 wherein said substrate includes a pattern layer formed beneath said character.

5. The semiconductor device of claim 1 wherein:

said character further comprises at least one second grating extending in a second direction along said surface, said first direction being in a non-parallel orientation to said second direction; and said at least one first grating visually contrasts with said at least one second grating such that said at least one first grating is visible by an observer without aid of magnification.

6. The semiconductor device of claim 5 wherein said at least one first grating abuts said at least one second grating.

7. The semiconductor device of claim 5 wherein said at least one second grating surrounds said at least one first grating.

8. The semiconductor device of claim 5 wherein said first direction is orthogonal to said second direction.

9. The semiconductor device of claim 5 wherein said at least one second grating includes a plurality of parallel etched lines.

* * * * *